US006815357B2

(12) United States Patent
Homma et al.

(10) Patent No.: US 6,815,357 B2
(45) Date of Patent: Nov. 9, 2004

(54) PROCESS AND APPARATUS FOR MANUFACTURING A SEMICONDUCTOR DEVICE

(75) Inventors: Yoshio Homma, Hinode (JP); Noriyuki Sakuma, Hachioji (JP); Hiroshi Nakano, Hitachi (JP); Takeyuki Itabashi, Hitachi (JP); Haruo Akahoshi, Hitachi (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/299,838

(22) Filed: Nov. 20, 2002

(65) Prior Publication Data

US 2003/0098241 A1 May 29, 2003

(30) Foreign Application Priority Data

Nov. 28, 2001 (JP) ..................... P2001-361912

(51) Int. Cl.$^7$ ........................................... H01L 21/311
(52) U.S. Cl. ................. 438/695; 438/697; 438/693
(58) Field of Search ............................. 438/633, 691, 438/692, 693, 697, 695, 678; 205/87

(56) References Cited

U.S. PATENT DOCUMENTS

| 4,954,142 A | 9/1990 | Carr et al. |
| 5,084,071 A | 1/1992 | Nenadic et al. |
| 6,287,954 B1 | 9/2001 | Ashley et al. |
| 6,348,731 B1 | 2/2002 | Ashley et al. |
| 6,354,916 B1 * | 3/2002 | Uzoh et al. ................. 438/692 |
| 6,475,909 B2 * | 11/2002 | Uozumi ...................... 438/678 |
| 6,670,272 B2 * | 12/2003 | Wu et al. .................... 438/692 |

FOREIGN PATENT DOCUMENTS

| JP | 2-278822 | 3/1990 |
| JP | 08064594 A * | 3/1996 ....... H01L/21/3205 |
| JP | 10-22285 | 7/1996 |

OTHER PUBLICATIONS

S. Lopatin, et al., "Integration of Electroless Cu and CoWP Multilayers in Damascene Process", Electrochemical Society Proceedings vol. 97–8, pp. 186–195.

* cited by examiner

*Primary Examiner*—Kevin M. Picardat
(74) *Attorney, Agent, or Firm*—Reed Smith LLP; Stanley P. Fisher, Esq.; Juan Carlos A. Marquez, Esq.

(57) ABSTRACT

A process for selectively forming a metal barrier layer on a surface of an interconnect of a wiring substrate comprising the steps of abrading the substrate and simultaneously feeding onto the substrate a plating solution having said metal dissolved therein. The abrading step comprises contacting the substrate against an abrasive surface and causing relative linear and/or rotary motion between the abrasive surface and the substrate while the substrate is in contact with the abrasive surface. Growth of the metal barrier layer on a portion of the wiring substrate other than the interconnect layer is suppressed and the metal barrier layer thus formed is thinner, exhibits improved uniformity and superior prevention against Cu diffusion.

25 Claims, 9 Drawing Sheets

PROCESS AND APPARATUS FOR MANUFACTURING A SEMICONDUCTOR DEVICE

BACKGROUND OF THE INVENTION

1. Field of the Invention

The present invention relates to a manufacturing apparatus of a wiring substrate and a manufacturing process for a wiring substrate using the apparatus, and particularly, to a polishing and manufacturing apparatus and a process for selectively forming a wiring substrate consisting of a copper or copper-based alloy (hereinafter referred to as "Cu") and a diffusion preventing layer ("barrier layer") for Cu.

2. Description of the Related Art

In recent years, replacement of interconnects using an aluminum alloy (which will hereinafter be abbreviated as "Al") with Cu interconnects has started in order to satisfy the requirement for speeding-up of large-scale semiconductor integrated circuits (abbreviated as "LSI"). Cu interconnects are usually, formed by the damascene method. In this method, as described in JP-A No. 278822/1990, a hole or trench (hereinafter referred to collectively as a "trench") is made in advance in an insulating film; a thin barrier layer made of tantalum (Ta) or tantalum nitride (TaN) for preventing Cu diffusion and improving adhesion is formed in the trench; a Cu layer is formed to embed the trench therewith; and the Cu layer and barrier layer at portions other than the trench are removed by chemical mechanical polishing (hereinafter referred to as CMP or "polishing"), whereby a damascene Cu interconnect structure having the Cu layer and the barrier layer embedded only in the trench is formed.

After completion of polishing, however, Cu embedded in the insulating film is exposed directly from the surface of the polished wiring substrate. Although multilevel interconnection by using Cu requires formation of an insulating film over Cu, a silicon oxide ("$SiO_2$") film or many insulating films composed of other materials are not suited, because they are poor in adhesion with Cu and moreover, prompt diffusion of Cu occurs in such insulating films. There are not many insulating materials which can be formed directly on the Cu exposed surface of a wiring substrate, have adequate adhesion and suppress Cu diffusion. Currently, silicon nitride ("SiN"), silicon carbide ("SiC") and the like are employed. They are however deficient in diffusion preventive capability and adhesion with Cu. Moreover, these materials have a high dielectric constant so that use of them increases electrostatic capacity between interconnects, thereby increasing the propagation delay of interconnect signals. In recent years, use of low-dielectric-constant materials as an insulating film for forming a trench therein has been studied in order to reduce electrostatic capacity between interconnects. The low-dielectric-constant material is usually low in density and diffusion rate of Cu therein is larger than in an $SiO_2$ film. So, there is a high risk that a further deterioration in long-term reliability occurs in the Cu multilevel interconnection using a low-dielectric-constant material. The conventional method of covering a Cu polished surface with an insulating film made of a silicon compound restricts the ability to improve the wiring characteristics and prevents maintenance of sufficient long-term reliability.

As another countermeasure against the above-described problem, a method of forming a cobalt (Co)—tungsten (W) alloy ("Co—W alloy") selectively on the Cu polished surface by electroless plating is described in "Proceedings of the Second International Symposium on Low and High Dielectric Constant Materials: Materials Science Processing and Reliability Issues (published by The Electrochemical Society), Vol. 97–8, 186–195". As illustrated in FIG. 3A, the wiring substrate 30 comprises a first insulating film 301 formed on a substrate 300 made of, for example, silicon, and after making an interconnect trench in the insulating film, a first barrier layer 303 and a first Cu interconnect layer 304 are embedded in the trench in order to improve adhesion with Cu and prevent diffusion of Cu. Polishing is usually employed for leaving the first Cu layer 304 and first barrier layer 303 only in the trench. By selective electroless plating, a barrier metal layer 305 is selectively formed over the Cu surface as illustrated in FIG. 3B (such a barrier metal layer formed by electroless plating will hereinafter be called "plated barrier layer"). Cobalt (Co) and nickel (Ni) are known materials of the plated barrier layer 305. In the electroless plating, an oxide on the surface of the underlying metal layer, for example, the first Cu interconnect layer 304 is etched or reduced, and depending on a slight difference in the chemical condition between the Cu surface and the peripheral surface of the first insulating film, particles for the formation of the plated barrier layer are precipitated only on the surface of the metal layer. Moreover, even within the surface of the Cu interconnect 304, precipitation of particles, which will constitute the plated barrier film 305, tends to occur easily at portions different in the state from the periphery, for example, so-called defective portions such as grain boundary or scratches generated during polishing. These precipitated particles are connected each other as illustrated in FIG. 3B, thereby forming a continuous plated barrier film 305 having a diffusion preventive capability against the Cu interconnect 304. To impart the plated barrier film 305 with sufficient Cu diffusion barrier effect, it was conventionally necessary to form the film having a thickness of 0.1 micron or greater. Such thickness of the plated barrier film 305 is too large where the Cu interconnect has the minimum processing dimension of about 0.2 micron or less. Only a slight difference exists in the chemical condition between the surface of the Cu interconnect 304 and the surface of the first insulating film 301 at the periphery thereof. If some pollutants or scratches exist on the surface of the first insulating film 301, abnormal growth particles 305b inevitably occur even at such defective portions. The conventional electroless plating therefore involves another problem that with the growth of the plated barrier film 305 as thick as 0.1 micron, the abnormal growth particles 305b increases, causing a short-circuits between interconnects and/or lower yields.

The conventional electroless plating is conducted in a manner as illustrated in FIG. 4. A plating vessel 43 stored in a heating tank 40 is filled with a plating solution 45 for a plated barrier layer. The solution is kept at a predetermined temperature by the heating tank 40. Electroless plating is usually conducted at 70 to 90° C. The plating solution 45 is stirred by a stirring rod 44. A wiring substrate 46 which has been surface-treated in advance is immersed in the solution for forming a barrier layer by plating. Since the temperature of the plating solution 45 is high, evaporation and, in turn, a change in the composition of the solution tend to occur. In order to prevent them, hollow plastic balls 47 are floated all over the surface of the plating solution. In such a conventional electroless plating method, the above-described surface treatment is conducted as pre-treatment for the formation of a plated barrier layer selectively on the Cu surface. The effect of this pre-treatment for improving selectivity, however, depends only on the effect of chemical treatment of the wiring substrate 46 with an acid or alkali solution. Effects of this pretreatment for removing foreign matters adhered to the substrate or pollutants whose removal is not intended by the chemical solution are not sufficient and abnormal nuclear growth of the plated barrier layer on the first insulating film cannot be prevented fully. On the contrary, sufficient removal of the substances adhered to the Cu surface sometimes makes it difficult to allow particles to grow all over the metal surface.

In JP-A No. 22285/1998, proposed is an idea of simultaneously causing polishing and plating of the polished surface by adding components of a plating solution to a polishing solution containing abrasive powder (which will hereinafter be called "slurry") for Cu upon processing of Cu interconnect by CMP. The slurry for metal needs to contain components which oxidize a metal surface (oxidative), while the plating solution needs to have reductive reaction of the metal surface. Soon after mixture, they react with each other so that such a mixture can hardly be used as a stable treating solution. The kinds of plating solutions that can be added to the slurry are limited to those for plating metals, such as gold and tin, which are reactive with Cu and have low melting points. Accordingly, heat-resistant Cu diffusion barrier effect cannot be attained by plating of Cu with such a metal material. Moreover, a conventionally known electroless plating solution contains a large amount of sodium ions. Upon electroless plating conducted within a temperature range of from 70 to 90° C., sodium ions diffuse quickly in a wiring substrate, thereby deteriorating the characteristics of each element formed on the wiring substrate. This adverse effect cannot be removed easily only by washing after electroless plating. Furthermore, an electroless plating solution usually needs a temperature control at 70 to 90° C., while CMP of Cu is conducted at room temperature of 20 to 30° C. It is therefore difficult to simultaneously perform CMP and plating under suitable conditions by using, as a mixture, a slurry for CMP and a plating solution. Even if CMP is conducted at a temperature as high as 70 to 90° C. suited for plating, severe corrosion of Cu occurs, disturbing high-precision polishing. CMP at about room temperature of 20 to 30° C., on the other hand, disturbs formation of a plated barrier layer.

In the conventional electroless plating, as illustrated in FIG. 5, there usually exists some suppressing time (which will hereinafter be called "incubation period") from the time of immersion of the wiring substrate in a plating solution until starting of the precipitation of a plated barrier layer in practice. The reason why such incubation period exists has not been made clear. This incubation time, however, varies greatly even within the wiring substrate or among wiring substrates, resulting in large variations in the thickness of the plated barrier film thus formed. In order to attain reliability necessary all over the surface of the wiring substrate, a markedly thick plated barrier film must be formed, leading to a deterioration in the flatness on the surfaces of interconnects, short-circuits between interconnects and an increase in the wiring resistance in multilevel interconnection.

To summarize, conventional electroless plating involves, in addition to necessity of a thick plated barrier layer and therefore unsuitability to minute Cu interconnects, the following drawbacks: (1) it tends to cause short-circuits between interconnects, (2) a stable plated barrier layer cannot be formed easily, (3) there tends to occur variations in the film thickness of the plated barrier layer within the wiring substrate or between wiring substrates, and (4) sodium ions contained in the barrier plating solution deteriorate the characteristics of the elements. Owing to such problems, it is not suited as a practically usable technique. It is necessary to suppress variations or instability in, the conventional electroless plating in order to apply it as a practical technique for the formation of a plated barrier layer.

SUMMARY OF THE INVENTION

The present invention provides a method capable of (1) forming a thin plated barrier layer which exhibits a diffusion preventive effect in spite of such a thin film thickness; (2) reducing variations in the thickness of the plated barrier layer within the wiring substrate or between wiring substrates, (3) suppressing the growth of a film formed by plating ("plated film") at a portion other than the wiring portion, thereby preventing the abnormal growth of particles which will otherwise be a foreign matter causing short-circuits between interconnects or a reduction of the yield. It is preferable upon carrying out the present invention that the sodium ions, which cause the deterioration in the characteristics of the semiconductor device, are removed from the plating solution to the maximum extent practical.

As shown in FIG. 2A, the surface of the wiring substrate 15 is preferably cleaned, as pretreatment, by sliding the substrate while pressing it against a resin pad 13 and pouring a cleaning liquid onto it. Then, plating is carried out selectively on the surface of a metal by forming a barrier layer while pressing the wiring substrate against the surface of a resin pad at a predetermined pressure, rotating it and feeding it with a plating solution. Upon plating, by keeping the wiring substrate as warm as the plating solution and maintaining the plating atmosphere less-oxidative in order to stabilize the growth of a film. An electroless plating apparatus developed newly for the above-described purpose, an electroless plating solution for a plating barrier in which sodium-ions are not included as a component material and a newly developed plating process make it possible to form a plated barrier layer which has markedly high stability and excellent Cu diffusion preventive effect.

The present invention provides a technique for forming a thin plated barrier layer resistant to Cu diffusion and excellent in barrier property by using a plating apparatus capable of suppressing film growth at a portion other than a metal layer. By using a sliding-type plating apparatus which has controlled the temperature of each of the wiring substrate, the resin pad and the plating solution to be supplied, it becomes possible to reduce the probability of the generation of foreign matters which will be causative of short-circuits between interconnects or lower yields. Moreover, fluctuations in the film thickness can be reduced by allowing the barrier layer to grow for a predetermined period of time after irradiating a light onto a wiring substrate and detecting the plating starting point by an optical means.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided herein below with reference to the attached drawings.

Figure 1A:
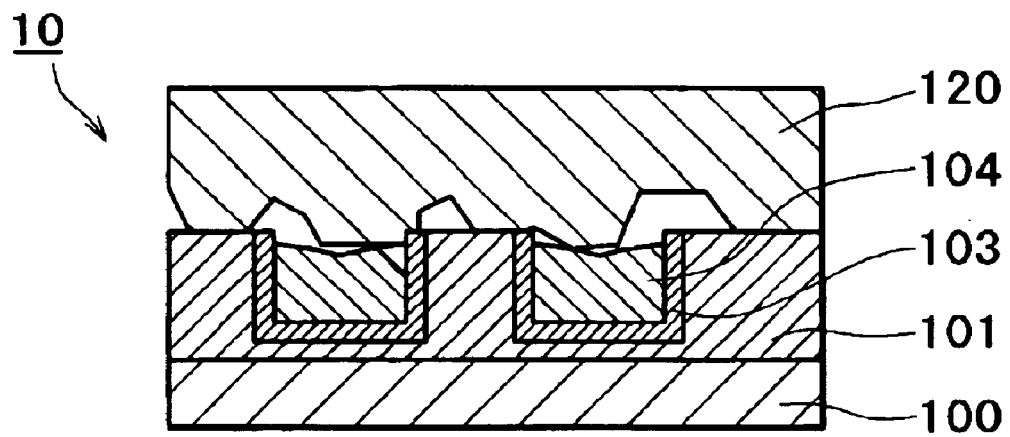
FIGS. 1A and 1B illustrate an electroless plating process of the present invention.

First, as illustrated in FIG. 1A, the wiring substrate 10 comprises a first insulating film 101 formed on the substrate 100. On an interconnect trench made in the first insulating film, formed is an interconnect embedded by CMP or the like with a first barrier layer 103 which is, for example, a laminate film of tantalum (Ta) and tantalum nitride (TaN), and a first Cu interconnect layer 104.

Prior to formation of a plated barrier layer selectively on the surface of this first Cu interconnect 104, degreasing, alkali cleaning and acid cleaning are preferably carried out as pretreatments. Some or all of these pretreatments can be omitted, depending on the cleanliness of the wiring substrate 10. For degreasing, various organic solvents, for example, alcohols such as methyl alcohol and isopropyl alcohol, and acetone are usable. Commercially available detergents for degreasing are also usable. For example, "Dasshi 5000" (trade name, product of Gospel Chemical) is put on the market. As an alkali detergent, an aqueous solution of potassium hydroxide or ammonium hydroxide is suited. As an acid detergent, dilute sulfuric acid and an about 5% aqueous solution of citric acid, and moreover an aqueous solution of potassium hydrogen sulfate are usable. If necessary, the wiring substrate 100 is not only immersed in such a detergent solution, but sliding while pressing it against a resin pad and feeding it with a detergent solution can also be adopted (not illustrated) as upon formation of a plated barrier film as described below. The latter sliding method is highly effective for removal of foreign matters or pollutants from the surface of the wiring substrate 10. Upon cleaning by sliding, a resin pad different from that used for the formation of a plated barrier film described below is preferably used.

The above-described cleaning treatment is preferably carried out in at a temperature near room temperature, at a temperature near the temperature upon formation of a plated barrier film as described below, or at a temperature between such two temperatures. When the wiring substrate 10 is cleaned at near room temperature, it may be heated to increase its temperature close to that upon formation of a plated barrier film. A heating mechanism (not illustrated) inside of a carrier for fixing the wiring substrate 10 may be used, but for heating in a short time, immersion of the wiring substrate 10 in deionized water, which has been heated to a predetermined temperature, after cleaning is effective. Alkali cleaning and acid cleaning can be carried out at about the same temperature as used during formation of a plated barrier film. In this case, the concentration of the cleaning solution must be decreased to the one-fifth or less of that when cleaning is conducted at near room temperature. Treating time must also be decreased to the one-fifth or less of that when cleaning is conducted at near room temperature. Thus, alkali or acid cleaning at such a high temperature is inferior in controllability.

Figure 1B:
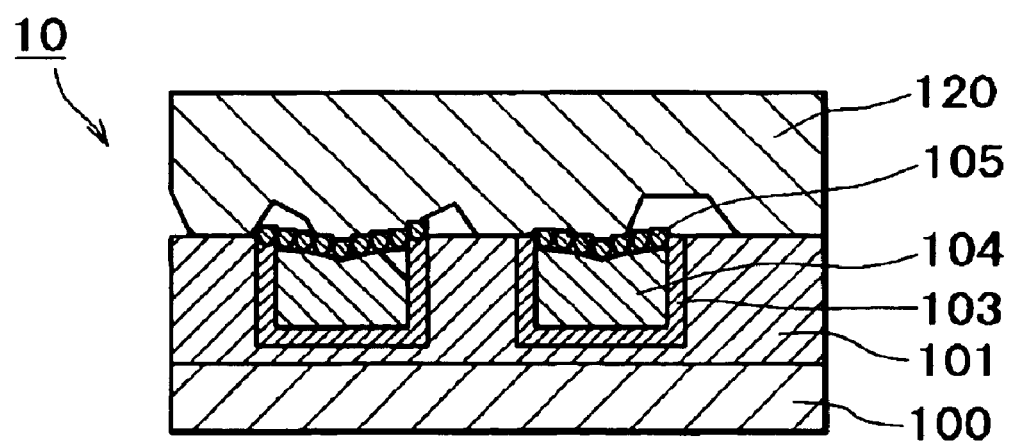

After these pretreatments, in the present invention, the wiring substrate 10 is not only immersed in a plating solution, but also pressed against a resin pad layer 120. Both the resin pad 120 and the wiring substrate 10 are maintained at a temperature suited for electroless plating. As illustrated in FIG. 1B, precipitation on the surface of the Cu interconnect 104 to form a plated barrier layer 105 then starts. Owing to the continuous friction with the resin pad 120, the growth rate of particles in a direction perpendicular to the resin pad decreases by at least 10% even if the temperature or composition of the plating solution is almost similar to that of the conventional method. Growth of particles in the horizontal direction relative to the resin pad hardly shows a change. Particles of the plated barrier layer showing an abnormal growth on the surface of the first insulating film 101 are removed by the friction with the resin pad 120. This markedly lowers the density of the abnormal growth particles of the plated barrier film over the first insulating film 101, resulting in the formation of the plated barrier layer 105, which is thinner than the conventional layer but is superior in Cu diffusion barrier effect so that short-circuits between interconnects hardly occur.

Figure 2A:
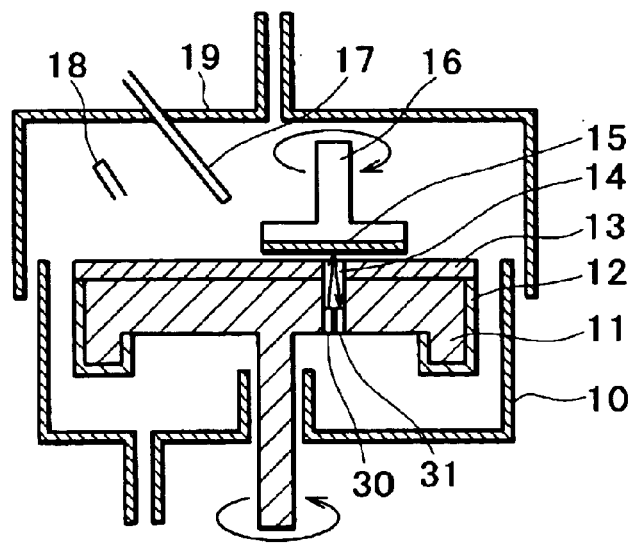
FIGS. 2A to 2C are schematic views illustrating an electroless plating apparatus used in the present invention.
Figure 2B:
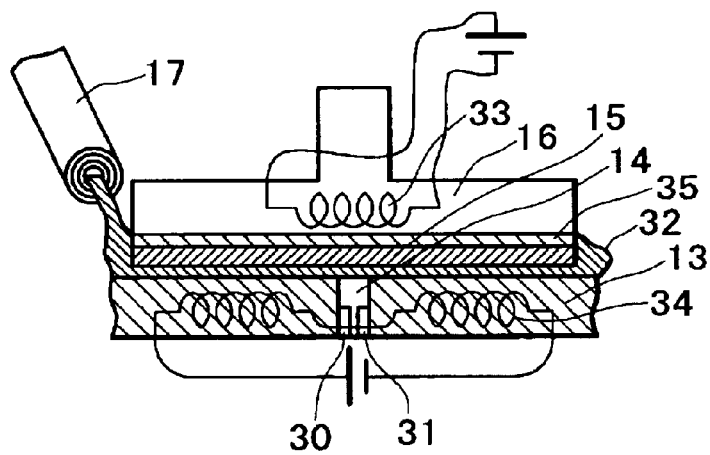
Figure 2C:
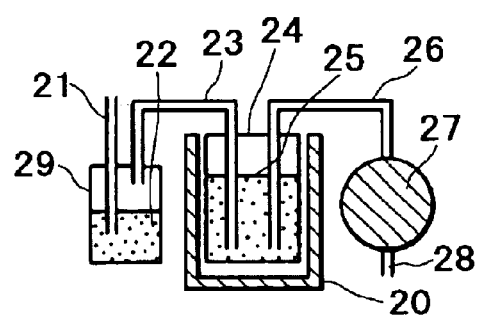
Figure 3A:
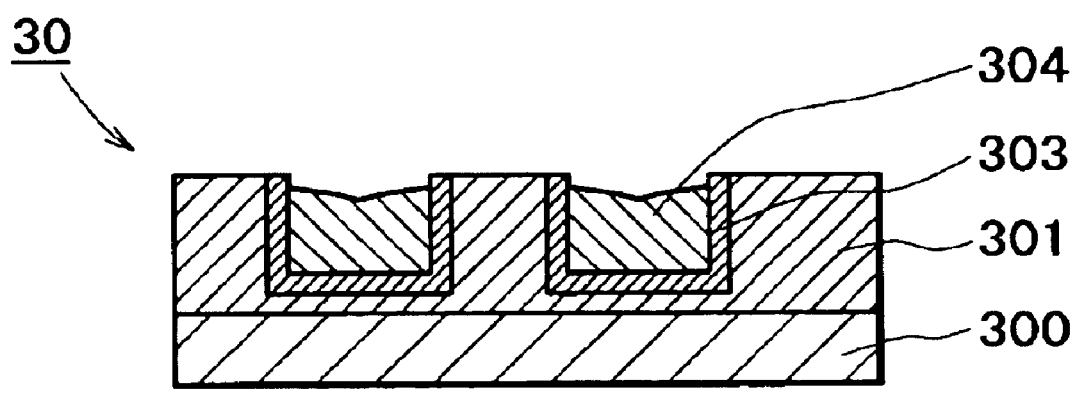
FIGS. 3A and 3B illustrate a conventional electroless plating process.
Figure 3B:
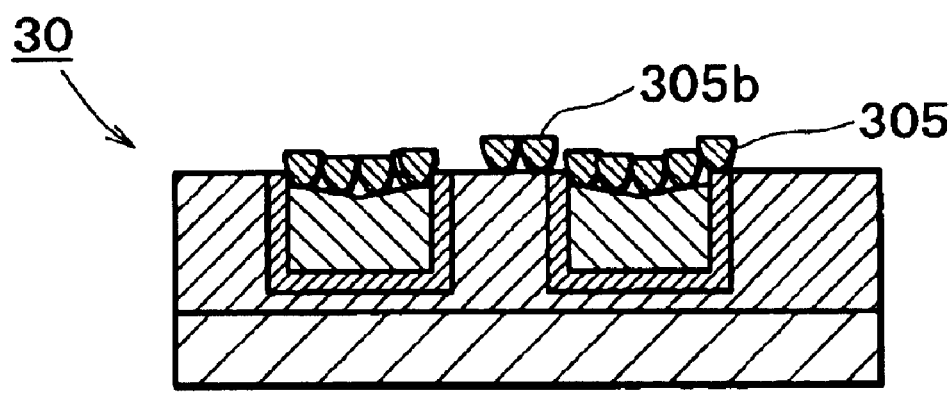
Figure 4:
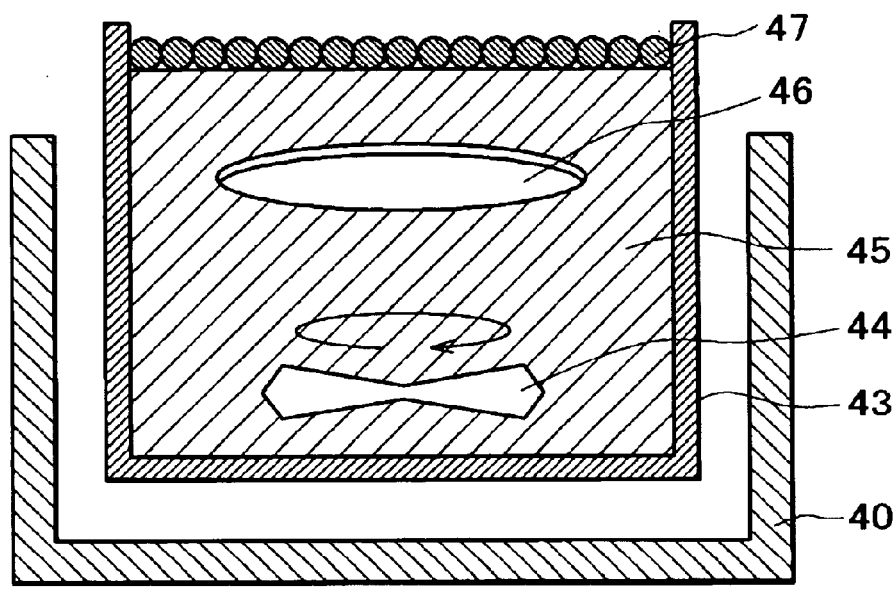
FIG. 4 illustrates an apparatus used for a conventional electroless plating process.
Figure 5:
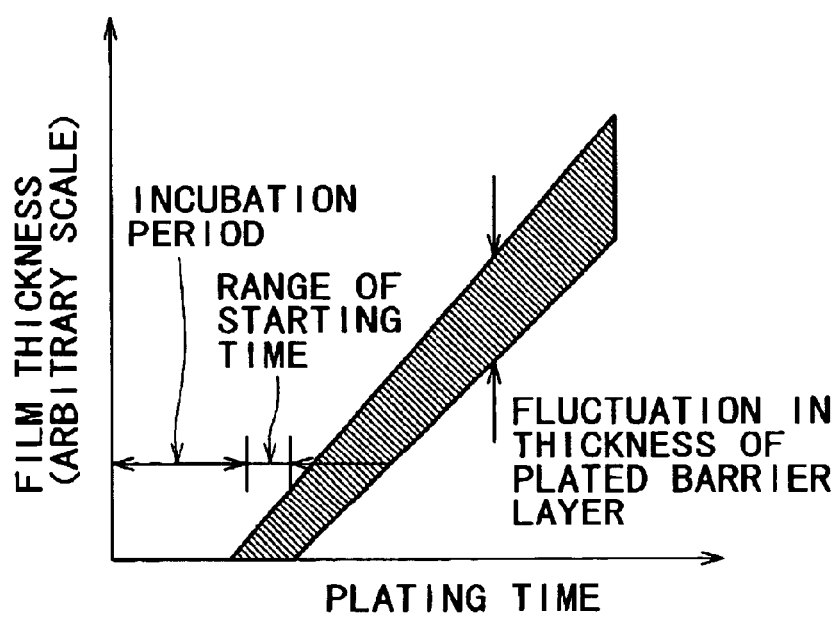
FIG. 5 illustrates problems of the conventional electroless plating process

The formation of such a plated barrier layer can be attained by the use of an apparatus as shown in FIG. 2. FIG. 2A is a schematic view of the apparatus of the present invention; FIG. 2B is an enlarged view in the vicinity of the wiring substrate 15; and FIG. 2C is an example of a feeder of a plating solution. In FIG. 2A, a rotary platen 11 is disposed inside of a tray 10. Resin coating 12 is applied to the side surfaces or lower surface of the rotary platen 11 as needed. Onto the surface of the rotary platen 11, a resin pad 13 is adhered. A hole 14 in the rotary platen 11 and resin pad 13 for observing plating progress is made as needed. The resin pad 13 is not essentially required to be fixed on the rotary platen 11 and rotate in accordance with the movement of the platen 11, but may be a belt type having a surface movable in at least one direction. The wiring substrate 15 is fixed on a carrier 16 and is preferably rotated, while being pressed against the surface of the resin pad 13 at a predetermined pressure. A plating solution 32 for the formation of a plated barrier layer is fed from a plating solution feed pipe via a plating solution feed port 17. The plating solution feed pipe has a double pipe structure (for example, a so-called liquid feed mechanism kept warm by a double pipe), whereby the solution temperature in the inside pipe is kept constant by the outside liquid (FIG. 2B). The temperature on the surface of the resin pad 13 is measured by an emission pyrometer 18 as needed and is utilized to adjust the rotary platen 11, carrier 16 or wiring substrate 15 to a predetermined temperature. The rotary platen 11, carrier 16 or wiring substrate 15 has, if necessary, a cover 19 for stabilizing the atmosphere during the electroless plating. For example, when non-oxidative nitrogen or argon is supplied inside of the cover 19, the atmosphere can be stabilized further. In the above-described apparatus, the rotary platen 11 and the carrier 16 are equipped with a heating mechanism 34 and a heating mechanism 33, respectively (FIG. 2B). These heat mechanisms may be, instead of a heater, another heating mechanism using a fluid.

As a result of the formation test of a plated barrier layer by using the apparatus of FIG. 2A, it has been found that even if the surface of the resin pad 13 or a plating solution fed via the plating solution feed port 17 is kept at a predetermined temperature, electroless plating does not start when the temperature of the wiring substrate 15 is low. For example, even if the surface of the resin pad 13 or a plating solution fed via the plating solution feed port 17 is kept at a predetermined temperature, when the wiring substrate 15 of room temperature is pressed against the resin pad, the temperature of the plating solution inevitably lowers by 5 to 10° C. momentarily, preventing stable formation of a plated barrier layer. Even if the temperature of the surface of the resin pad 13 or the temperature of the plating solution is heightened in advance in view of such a temperature decrease, temperature distribution within the wiring substrate 15 becomes uneven, which sometimes prevents uniform barrier plating. Moreover, an excessive increase in the temperature of the plating solution tends to cause its compositional change, which sometimes causes unstable plating. As the resin pad 13, a polishing pad used for CMP is usable. Preferred examples include a polishing pad made of a foamed polyurethane resin, a polishing pad made of a non-woven cloth impregnated with a polyurethane resin, and a foamed fluorocarbon resin pad. As the resin pad 13, not only a polishing pad but also a sheet-like resin used for cleaning, for example, a sheet made of a polyvinyl alcohol resin may be used. The wiring substrate 15 is preferably pressed against the resin pad at 10 to 350 g per cm$^2$ ("g/cm$^2$"), with a range of 10 to 250 g/cm$^2$ being especially preferred. The conventional electroless plating temperature ranges from 70 to 90° C., while, in the present invention, temperature can be set within a range of from 45 to 90° C. The higher the electroless plating temperature, deterioration or peeling of the resin pad 13 or a resin sheet 35 which holds the wiring substrate 15, sandwiched between the carrier 16 and the wiring substrate 15 tends to occur. Deterioration of these resin parts can be suppressed by lowering the electroless plating temperature.

It is effective to keep a less-oxidative plating atmosphere in order to stabilize electroless plating. Removal or reduction of oxygen dissolved in the plating solution itself is also effective. The plating solution feed system as illustrated in FIG. 2C is preferably used for this purpose. A first container 29 has, stored therein, a solvent 22 made of a component constituting the plating solution or water. A non-oxidative gas (not illustrated) is introduced into the solvent via an inlet tube 21. The inlet tube 21 enters inside of the solvent 22 and there, bubbling is conducted. A gas (not illustrated) in the first container 29 is then introduced into a second container 24 via an intermediate pipe 23. The second container 24 does not need hermetic sealing and the gas introduced from the first container and bubbled in the plating solution 25 may be released outside. The plating solution 25 is taken out through a second intermediate pipe 26 by a pump 27 and fed from a plating solution inlet hole 17 to the surface of the resin pad 13 via a pipe 28. The second container 24 is stored inside of a temperature controlled bath 20, whereby the plating solution 25 is kept at a predetermined temperature. In an alternate preferred embodiment, the plating solution feed system of the present invention may be equipped to keep the plating solution at a predetermined temperature and to take out a necessary amount of the plating solution and feed it to the plating apparatus. It may also be equipped with a function of feeding a non-oxidative gas to the plating solution as needed. Alternatively, by supplying a non-oxidative gas, which has been bubbled in the solvent 22 via the inlet tube 21, to the plating solution 25, it is possible to reduce the concentration of dissolved oxygen in the plating solution 25, and to carry out electroless plating stably while suppressing evaporation of the components of the plating solution, thereby preventing a compositional change. Plating with the wiring substrate 15 being slid relative to the resin pad 13 is highly effective for removal of pollutants or foreign matters from the surface of the wiring substrate 14 and for keeping the surface condition of the Cu interconnect (not illustrated in FIGS. 2A to 2C) uniform.

By making the observation hole 14 in the rotary platen 11 and resin pad 13, the end of the incubation period and start of electroless plating can be detected. The Cu has a reddish white surface, while Co—W barrier film is grayish white, so that after irradiation of a red light, a change in the intensity of a reflected light may be detected. Instead of red, a green or yellow light may be employed. The reflection intensity usually lowers when the formation of a plated barrier layer begins. This enables detection of the starting time of electroless plating. It is possible to reduce variations in the thickness of a plated barrier film, compared with the conventional method, by carrying out electroless plating for a predetermined time after the starting point of electroless plating is detected.

The plating solution always has a dark color because of the high concentration of metal ions it contains. When the conventional electroless plating apparatus is used, the surface of the wiring substrate 15 cannot be observed from the outside. In the present invention, since the distance between the resin pad 13 and the wiring substrate 15 is constantly as narrow as about 100 $\mu$m or less, it is possible to identify the starting point of electroless plating by irradiating a light from a light emitting element 30 through the observation hole 14, accepting the reflected light by a photo accepting device 31 and then detecting a change.

In the present invention, the surface of the resin pad 13 may be measured using a radiation thermometer 18 of FIG. 2. As the radiation thermometer, "RT70" (trade name; product of Yamatakesha) and "TOP-510LD" (trade name; product of Neopt Corp.) are preferably used.

EXAMPLE 1

Example 1 will next be described with reference to FIGS. 1 and 2. In FIG. 1A, a silicon oxide (which will hereinafter be called "p-TEOS") film, which has been formed by plasma CVD by using tetraethoxysilane (TEOS), which is an organosilicon compound, as a raw material, is formed as a first insulating film 101 having a thickness of 0.8 micron over the substrate 100 made of an silicon wafer having a diameter of 4 inches. In the first insulating film 101, formed is an interconnection trench of 500 nm deep in which a first barrier layer 103 of 30 nm thick made of Ta and TaN and a first Cu interconnect 104 has been embedded. For the formation of the interconnection trench, known dry etching technique was employed. The first Cu interconnect 104 was formed by embedding Ta and TaN, and the Cu interconnect in the trench by known sputtering and electroplating and then removing the unnecessary portions by CMP. Prior to electroless plating, the wiring substrate 10 was etched with a diluted hydrofluoric acid solution [1:99 (weight ratio) mixture of hydrofluoric acid and water]. The etching amount was 20 nm in terms of the p-TEOS film. As a resin pad 120, "IC1000" (trade name; product of Rodel, Inc.) made of a foamed polyurethane resin was employed. The wiring substrate 10 was moved at a relative speed (which will hereinafter be called "sliding speed") of 60 m/min while being pressed and rubbed against the resin pad 120. During this movement, the wiring substrate 10 was caused to rotate about its axis at 60 rpm (rpm: revolutions per minute). The wiring substrate 10 and resin pad 120 were kept at 75±2° C. in advance. Between the resin pad 120 and the wiring substrate 10, an electroless plating solution maintained at 75±2° C. was fed. The above-described pretreatment by a dilute hydrofluoric acid solution was conducted using a similar apparatus and similar resin pad to those used for electroless plating except that the wiring substrate 10 and resin pad were not heated in advance. Thereafter, the wiring substrate 10 was pressed against the resin pad 120 as illustrated in FIGS. 1A and 1B and heated, prior to the supply with an electroless plating solution, to a predetermined temperature of 75±2° C. Heating was conducted using a heating mechanism 33 inside of the carrier 16 (refer to FIG. 2B) upon which the wiring substrate 10 was fixed. In this Example, heating was conducted using the heater disposed inside of the carrier. Alternatively, the wiring substrate 10 may be heated by feeding a heated fluid inside of the carrier.

The electroless plating solution used in this Example contains: cobalt chloride 0.1 (mol/liter) tripotassium citrate 0.3 (mol/liter) dimethylaminoborane 0.06 (mol/liter); potassium tungstate 0.03 (mol/liter); and RE610 0.05 (g/liter, surfactant of Toho Chemical). Plating was conducted at 75° C. for 5 minutes.

A tetramethylammonium solution as a pH regulator was added to adjust the pH to 9.5. Electroless plating can be performed when the pH falls within a range of from 9.0 to 10.5.

Use of this plating solution 32 is accompanied with a drawback that the resin pad 120 tends to deteriorate owing to high plating temperature of 75° C. The plating solution employed here however contains potassium ions instead of sodium ions which are conventionally employed. Different from sodium ions, potassium ions can be removed fully by washing the surface of the wiring substrate after plating so that no characteristic deterioration occurs even if a semiconductor device (not illustrated) is formed in the wiring substrate 10. In this Example, a plated barrier film 105 composed mainly of Co—W was formed selectively over the Cu interconnect at a thickness of about 50 nm in 5 minutes (in practice, the plated barrier film 105 contains, in addition to Co and W, boron (which will be abbreviated as B) so it may be expressed by Co—W—B, but it will hereinafter be abbreviated as Co—W unless otherwise indicated).

Observation on the surface of the first insulating film 101, the first barrier film 103 and first Cu interconnect 104, revealed that abnormal growth of the Co—W plated barrier film 105 on the fist insulating film 101 was hardly observed and had a density of only 0.1 piece/cm$^2$ or less. When electroless plating is performed in the conventional manner by using the same plating solution, the abnormal growth density was 1.0 piece/cm$_2$ or greater, suggesting a decrease of defect density to 1/10 or less. This wiring substrate 10 was heat treated at 500° C. for 1 hour, but no Cu was detected from the surface of the Co—W plated barrier film 105. As a result, it has been found that the plated barrier film of the present invention has excellent heat resistance, though it was as thin as 50 nm.

EXAMPLE 2

Example 2 will be described with reference to FIGS. 1A, 1B and 2A to 2C. As a wiring substrate 10, a similar substrate to Example 1 was employed. In this Example, a Ni plated barrier film was formed over the Cu interconnect 103. An electroless plating solution used in this Example has the following composition: nickel chloride 0.1 (mol/liter); tripotassium citrate 0.3 (mol/liter); dimethylaminoborane 0.06 (mol/liter); potassium tungstate 0.03 (mol/liter); RE610 0.05 (g/liter, surfactant of Toho Chemical).

A tetramethylammonium solution as a pH regulator was added to adjust the pH to 9 or greater. Electroless plating can be performed when the pH falls within a range of from 9.0 to 10.5.

Temperature upon electroless plating was set at 70° C. The plating solution (not illustrated), resin pad 103, and wiring substrate 15 were kept at 70±2° C. For electroless plating, a plating solution feeder as illustrated in FIG. 2C and deionized water serving as a solvent 22 were employed. From an inlet tube 21, nitrogen was fed at a rate of 0.3 liter/min to cause bubbling and the resulting bubbled gas was added to the plating solution 25. Feeding of the bubbled gas minimized the evaporation of the plating solution 25 and at the same time, a decrease in the dissolved oxygen in the plating solution 25 enabled temperature decrease of electroless plating. By a motorized pump 27, the plating solution was fed over the resin pad 120 of FIG. 1 (or 13 of FIG. 2A) at a rate of 0.2 liter/min. The pressure to be applied to the resin pad in the electroless plating solution, the sliding speed and the rotational speed of the wiring substrate itself were set 140 g/cm$^2$, 60 m/min and 60 rpm, respectively. Prior to electroless plating, the surface of the wiring substrate 15 (FIGS. 2A and 2B) was etched with a dilute hydrofluoric acid solution (a 1:99 (weight ratio) mixture of hydrofluoric acid and water). The etching amount was 20 nm in terms of a p-TEOS film. Under the above-described conditions, a plated barrier film made of a Ni—W alloy was formed selectively over the Cu interconnect 104 to give a thickness of 500 nm.

The defect density due to the abnormal nuclear growth formed on the surface of the first insulating film 101 other than the plated barrier film 105 over the Cu interconnect 104 was suppressed to 0.1 piece/cm$^2$. As a result of observation on the surface of the Cu interconnect 104 after heat treatment of the thus-formed wiring substrate 10 at 500° C. for 1 hour, no Cu was detected from the surface of the plated barrier film 105 over the Cu interconnect 104. This suggests that the plated barrier film has almost equal heat resistance to that of the plated barrier film obtained in Example 1.

EXAMPLE 3

This Example will be described with reference to FIGS. 1A, 1B and 2A to 2C. In FIG. 1A, a first insulating film 101 made of p-TEOS and having a thickness of 0.8 micron is formed over a substrate 100 made of a silicon (Si) wafer having a diameter of 4 inches. In the first insulating film 101, formed is an interconnection trench of 500 nm deep in which a barrier layer 103 of 30 nm thick and made of Ta and TaN and a Cu interconnect 104 have been embedded. As a resin pad 120, "IC1000" (trade name; product of Rodel, Inc.) made of a foamed polyurethane resin was employed. Prior to electroless plating, the wiring substrate 10 was etched with a 0.3 mol % aqueous citric acid solution. By this etching, the p-TEOS film is scarcely etched, but the oxide on the surface of the Cu interconnect 104 can be removed. The wiring substrate 10 was pressed against the resin pad 120 and the sliding speed was set at 60 m/min. While sliding, the wiring substrate 10 (15 in FIG. 2A) rotates on its axis at 60 rpm. The wiring substrate 10 and resin pad 120 were kept at 50±2° C. in advance. Between the resin pad 120 and the wiring substrate 100, an electroless plating solution maintained at 50±2° C. was fed. As the electroless plating solution, a similar solution to that used in Example 1 except for the use of cobalt sulfate instead of cobalt chloride and citric acid and tungstenic acid instead of potassium citrate and potassium tungstate was used. The plating solution was kept alkaline by the addition of tetramethylammonium. Its pH preferably falls within a range of 9 to 10.5, with a range of from 9.5 to 10.0 being especially preferred.

The plating time is about 5 minutes. Decrease in the plating temperature to 50° C. made it possible to prevent deterioration of the resin pad 120 and the like. Another advantage of the plating solution used in this preferred example is that since it is free of alkali metal or alkaline earth metal ions, washing after plating can be carried out very easily. In this Example, over the Cu interconnect 104, a plated barrier film 105 made of a Co—W alloy was selectively formed to give a thickness of about 30 nm.

As a result of observation on the surface portion of the first insulating film 101, the first barrier film 103 and first Cu interconnect 104, abnormal growth of the plated barrier film 105 made of a Co—W alloy on areas other than the interconnect 104 was hardly observed and, again its density was 0.1 piece/cm$^2$ or less. When electroless plating was performed in the conventional manner by using the same plating solution, the density was 1.0 piece/cm$^2$ or greater, suggesting a decrease of defect density to 1/10 or less. This wiring substrate 10 was heat treated at 500° C. for 1 hour, but no Cu was detected on the surface of the Co—W plated barrier film 105 formed over the Cu interconnect 104 by plating. As a result, it has been found that the plated barrier film of the present invention has excellent heat resistance.

EXAMPLE 4

In this Example, detection of the starting time of a plated barrier film formation and control of its ending point were conducted by irradiation of a light and observation of a reflected light thereof. The constitution of a wiring substrate and plating conditions were similar to those employed in Example 3. This example will hereinafter be described with reference to FIGS. 2A to 2C. Upon electroless plating in accordance with the procedure as described in Example 3, a light was irradiated to the surface of a wiring substrate 15 through an observation hole 14 by using a light emitting device 30 disposed inside of a rotary platen 11 as illustrated in FIG. 2A. The plating solution used in this Example was dark reddish violet so that a red light emitting diode was preferably used as an incident light. When the plating solution is bluish green, for example, used for the formation of a nickel plated barrier film, a green or blue light is usable as well as a red light. A plating solution 32 was fed onto a resin pad 13 and the wiring substrate 15 was caused to rotate on its axis and simultaneously pressed against the surface of the resin pad 13. The reflected light was observed by a photo-detecting device 31. About 30 seconds after the observation was started, the reflected light showed a marked attenuation over 20 seconds and then, it almost recovered the initial value. Plating was stopped 150 seconds after starting of attenuation. The thickness of the plated barrier film at that time was 30 nm. A temporary attenuation of the reflected light at the initial stage of the plating is presumed to occur because precipitation of Co—W particles of the plated barrier film on the surface of a Cu interconnect (not illustrated) on the surface of the wiring substrate 15 began and impaired the evenness of the surface of the Cu interconnect. As the Co—W film formed the plated barrier of a continuous film, the reflected light recovered its intensity. Although there exists variations of about ±10 seconds in the attenuation starting time, depending on the wiring substrate, variations in the thickness of the plated barrier film (not illustrated) among wiring substrates can be controlled within a range of ±5% by setting the plating time from the attenuation starting point at a predetermined time. Compared with the conventional method in which about ±20% error was observed, controllability showed a marked improvement. The plating solution for a Co—W alloy barrier film is reddish violet so that red is preferred as a light to be irradiated in this example. As a light source, a red light emitting diode or laser is preferred.

When a Ni—W plated barrier film is formed as in Example 2, on the other hand, a plating solution for the barrier film is green. As a light source for observation, a green or blue light emitting diode or laser is preferred in such case. A variety of such light emitting diodes or lasers are put on the market so that they are usable. Either a light emitting diode or laser can be used as a light source, because the distance from the observation hole 14 to the wiring substrate 15 is short. If the plating apparatus as illustrated in FIG. 2 is equipped with a red or green, more preferably blue light emitting diode or laser as a light source for irradiation from the observation hole 14, it is useful for the detection of plating starting time irrespective of the kind of the plating solution. The output of the light source can be set at 1 mW or less.

EXAMPLE 5

Figure 6A:
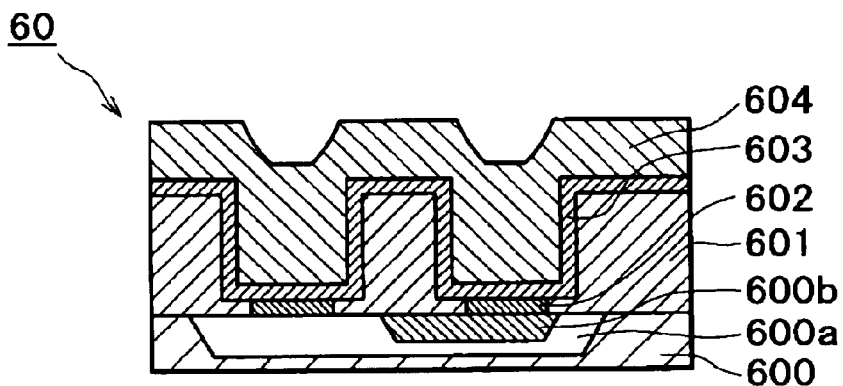
FIGS. 6A to 6C illustrate a Cu multilevel metallization process according to the present invention.
Figure 6B:
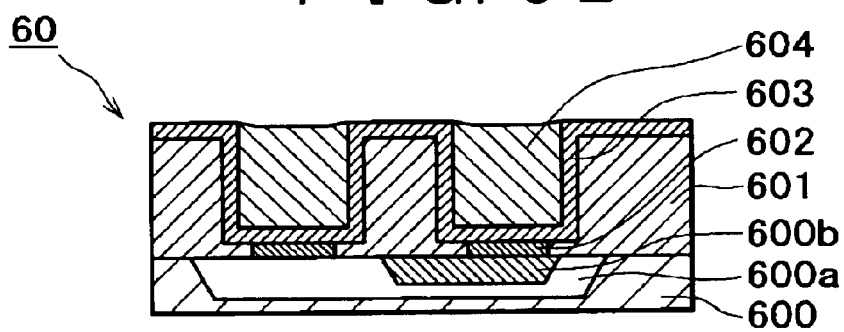
Figure 6C:
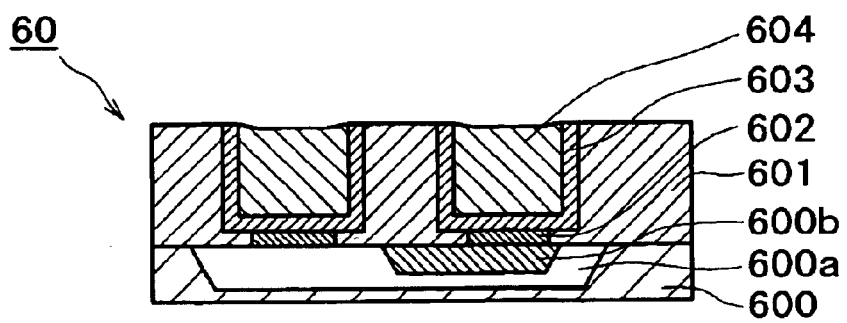
Figure 7A:
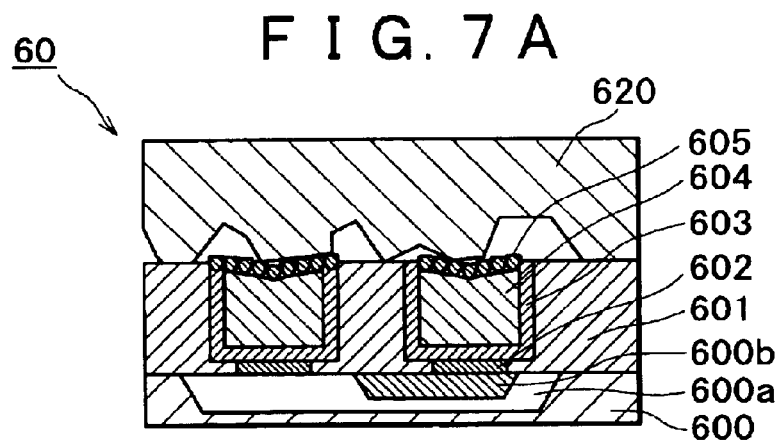
FIGS. 7A to 7C illustrate a Cu multilevel metallization process according to the present invention.
Figure 7B:
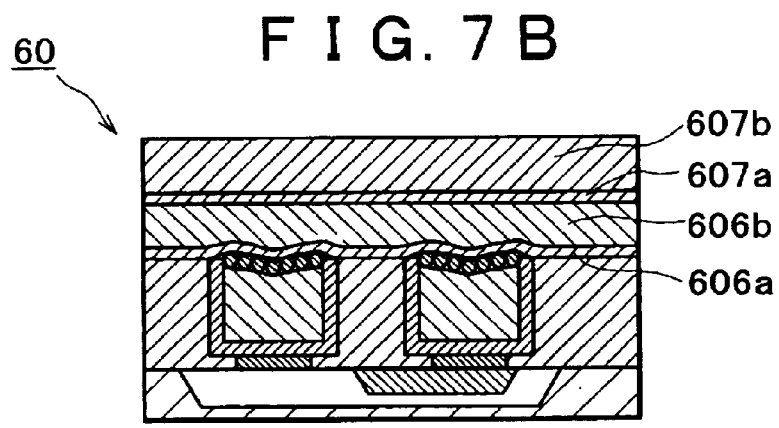
Figure 7C:
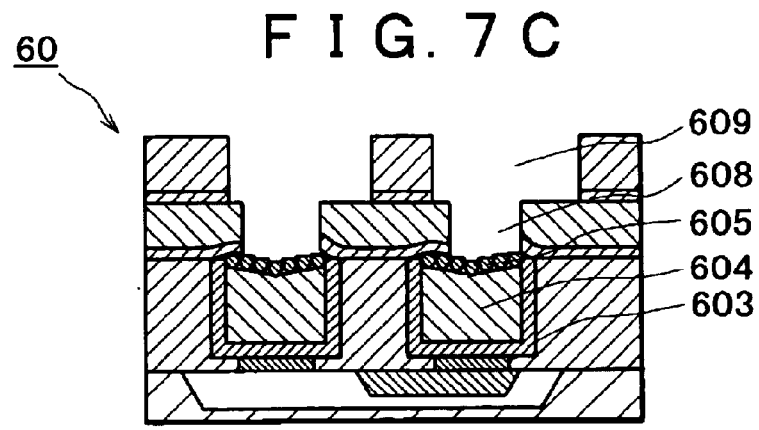
Figure 8A:
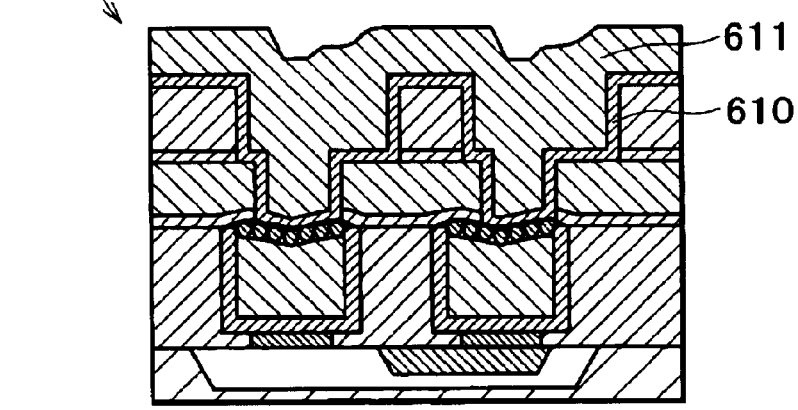
FIGS. 8A to 8C illustrate a Cu multilevel metallization process according to the present invention.
Figure 8B:
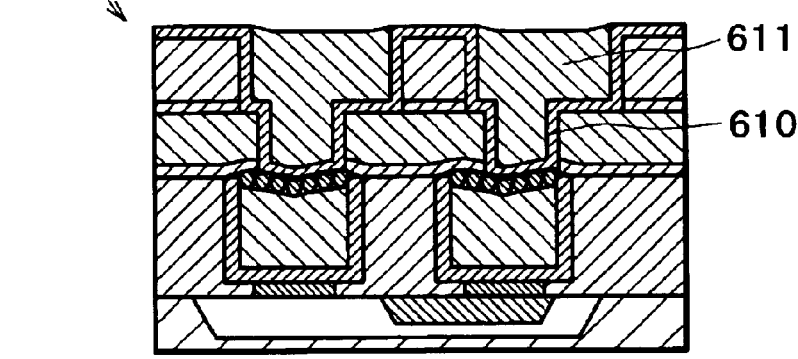
Figure 8C:
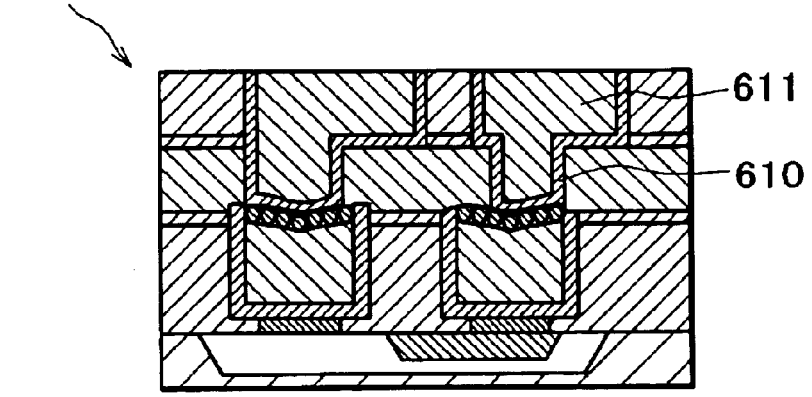

In this Example, application of the present invention to multilevel metallization of at least two layers will be described with reference to FIGS. 6A to 6C, 7A to 7C and 8A to 8C. A plating solution similar to that employed in Example 3 was used in this Example. In FIG. 6A, the wiring substrate 60 comprises a p-type diffusion layer 600a and an n-type diffusion layer 600b formed in the substrate 600 made of a silicon wafer. Over them, a first insulating film 601 comprising a laminate of an SiO$_2$ film (laid by thermal oxidation method), p-TEOS film or the like is laid. In a connecting hole (hereinafter referred to as a "contact hole") for connecting with the diffusion layers 600a and 600b in the wiring substrate 600, a tungsten plug 602 has been formed. In the insulating film 601, a trench is formed and a barrier layer 603 and a first Cu interconnect 604 are embedded therein. In FIG. 6B, the first Cu interconnect 604 is polished to expose the barrier layer 603. In FIG. 6C, the barrier layer 603 and the first Cu interconnect 604 are polished to expose the first insulating film 601, whereby so-called damascene interconnection having the barrier layer 603 and the first Cu interconnect 604 embedded in the trench of the insulating film is formed. Here, the barrier layer is made of a laminate film of Ta and TaN. As illustrated in FIG. 7A, a plated barrier film 605 is formed over the wiring substrate 600 under the conditions similar to those employed in Example 3. As illustrated in FIG. 7B, formed are a second etching stopper film 606a made of a SiC film formed by plasma CVD, a second insulating film 606b made of a fluorine-added silicon oxide (FSG) film, a third etching stopper film 607a made of SiC and a third insulating film 607b made of FSG. In accordance with the processing steps of the known dual damascene method, a VIA hole 608 and a second-level Cu interconnect trench 609 are formed as illustrated in FIG. 7C. Then, as illustrated in FIG. 8A, a second barrier layer 610 and a second Cu interconnect 611 are formed, followed by polishing of the second Cu interconnect 611 to expose the second barrier layer 610 as illustrated in FIG. 8B. By removing the unnecessary portions of the second barrier layer 610 and second Cu interconnect 611, a dual damascene interconnection structure can be formed as illustrated in FIG. 8C. They are polished by the known CMP. In this Example, the plated barrier layer 605 remains on the bottom of the VIA hole 608 so Cu diffusion preventive capability is markedly high. In particular, the conventional structure was accompanied with the problems that the surface of the underlying Cu interconnect must be covered with an SiN or SiC film having a large dielectric constant and even so, diffusion cannot be suppressed sufficiently when the wiring distance is minute. The structure according to this Example is, on the other hand, highly reliable because the first Cu interconnect 604 is protected by the plated barrier layer 605, making diffusion difficult. In the conventional structure without plating barrier 605, the surface of the first Cu interconnect 604 exposed upon opening of the second interlevel contact hole 608 is inevitably etched. The Cu compound thus etched is not a large amount but it adheres to the side walls of the second interlevel contact hole 608 or second interconnection trench 609. Deposition of Cu on the side walls of the second or third interlevel insulating film 606b or 607b prior to the formation of the second barrier layer 610 for the second Cu interconnect 611 sometimes causes a deterioration of the insulating film or a characteristic deterioration of the device in the wiring substrate 60. Removal of Cu deposit by washing the surface of the wiring substrate 60 is effective for preventing such a deterioration, but the surface of the first Cu interconnect 604 is etched upon washing, decreasing reliability. In the structure of FIG. 8(c) it is preferable to form another plated barrier layer on the surface of the second Cu interconnect 611.

EXAMPLE 6

Figure 9A:
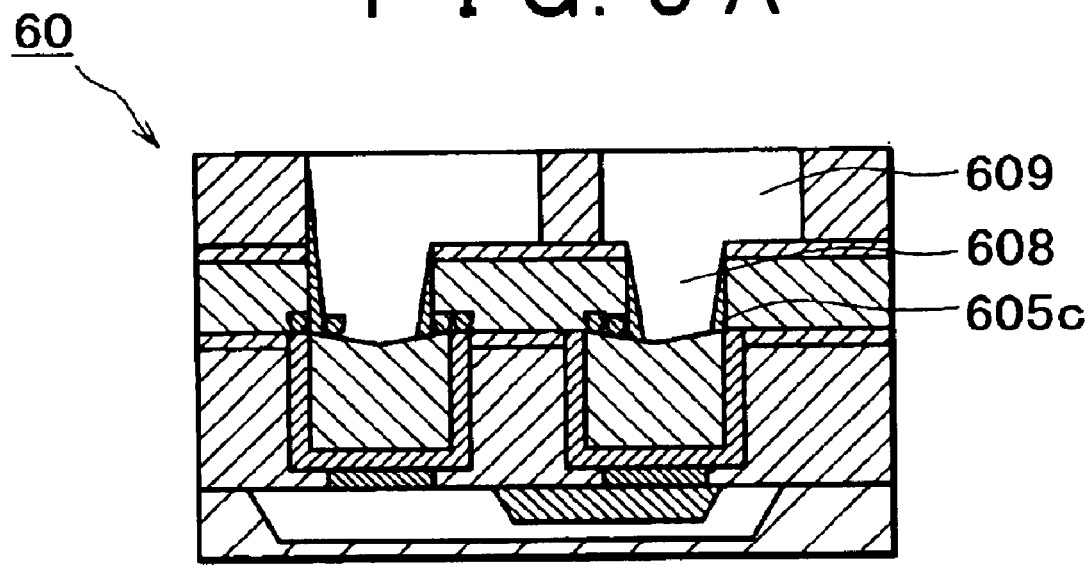
FIGS. 9A and 9B illustrate a Cu multilevel metallization process according to the present invention.
Figure 9B:
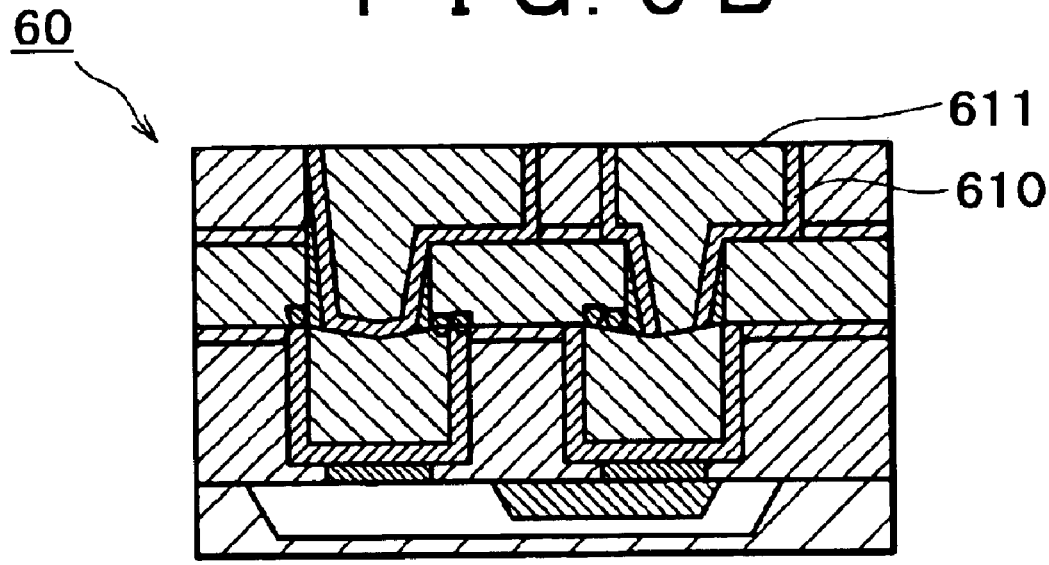
Figure 10:
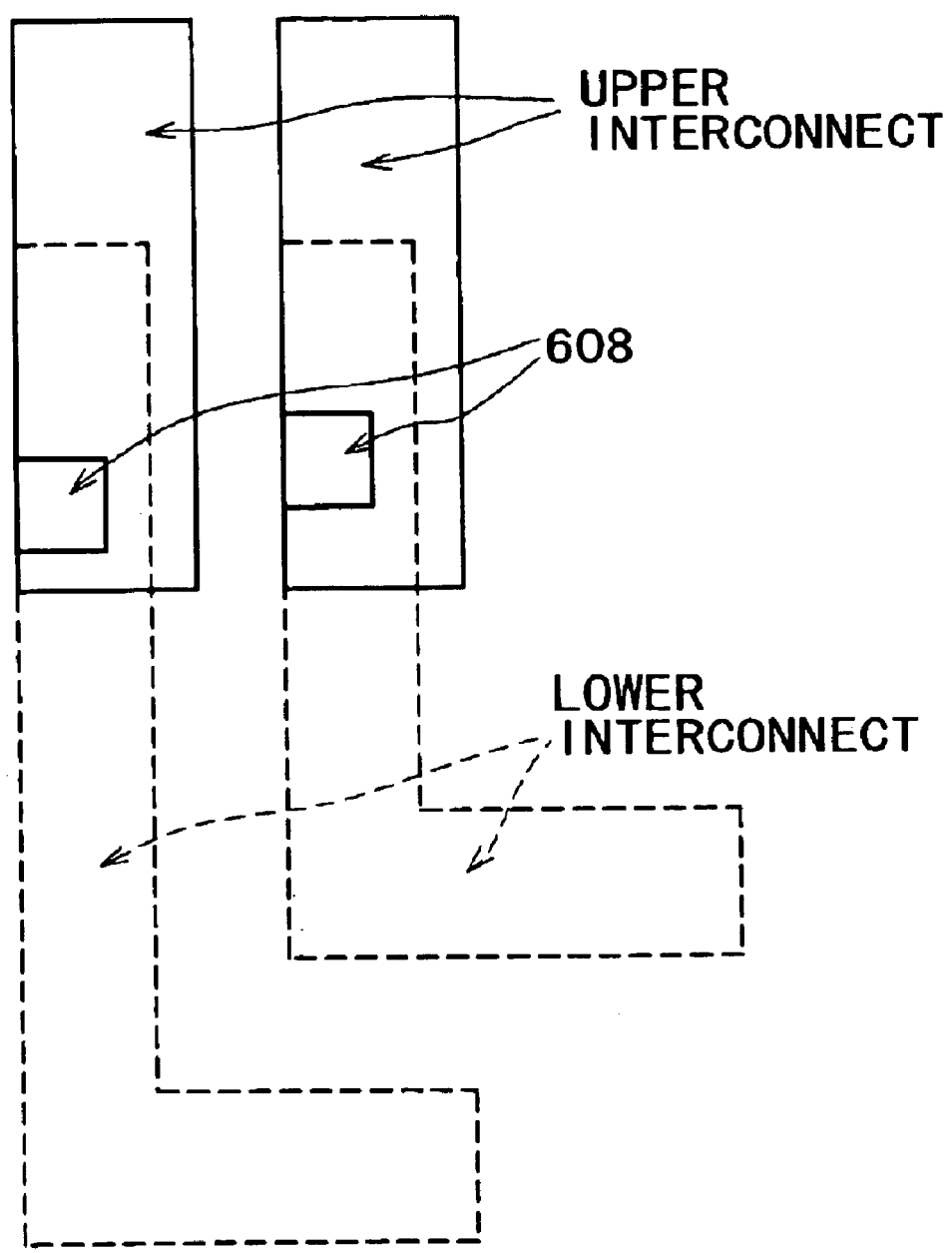
FIG. 10 is a plan view of multilevel interconnection according to the present invention.

Another example of application of the present invention to the multilevel metallization of at least two layers will next be described with reference to FIGS. 6A to 6C, 7A to 7C, 9A and 9B. A plating solution used in this Example was similar to that employed in Example 3. In FIG. 6A, the wiring substrate 60 comprises a p type diffusion layer 600a and an n-type diffusion layer 600b formed in the substrate 600 made of a silicon wafer. Over them, a first insulating film 601 comprising a laminate of an SiO$_2$ film (laid by thermal oxidation method), p-TEOS film or the like is laid. In a contact hole for connecting the diffusion layers 600a and 600b in the wiring substrate 60, a tungsten plug 602 has been formed. In the insulating film 601, a trench is formed and a barrier layer 603 and a first Cu interconnect 604 are embedded therein. In FIG. 6B, the first Cu interconnect 604 is polished to expose the barrier layer 603. In FIG. 6C, the barrier layer 603 and the first Cu interconnect 604 are polished to expose the first insulating film 601, whereby so-called damascene interconnection having the barrier layer 603 and the first Cu interconnect 604 embedded in the trench of the insulating film is formed. Here, the barrier layer is made of a laminate film of Ta and TaN. As illustrated in FIG. 7A, a plated barrier film 605 is formed over the wiring substrate 60 under the conditions similar to those employed in Example 3. As illustrated in FIG. 7B, formed are a second etching stopper film 606a made of an SiC film formed by plasma CVD, a second insulating film 606b made of an FSG film, a third etching stopper film 607a made of SiC and a third insulating film 607b made of FSG. In accordance with the processing steps of the known dual damascene method, an interlevel contact hole 608 and a second-layer Cu interconnect trench 609 are formed as illustrated in FIG. 7C. Then, as illustrated in FIG. 9A, by sputter etching using Ar, the bottom of the interlevel contact hole 608 was etched to remove the plated barrier layer 605 and expose the surface of the first Cu interconnect layer 604. A portion of the plated barrier film 605 removed by sputter etching adheres to the side walls of the interlevel contact hole 608 or interconnection trench 609 as a re-deposit 605c. This re-deposit 605c has a diffusion preventive effect against Cu so that it does not lower the reliability of Cu interconnection. As illustrated in FIG. 9B, after formation of a second barrier layer 610 and embedding of Cu for a second Cu interconnect 611, the barrier layer 610 and Cu interconnect 611 on a portion of the insulating film other than the interlevel contact hole and interconnection trench are removed by CMP, whereby a dual damascene interconnection is formed. In this Example, the plated barrier layer 605 formed over the first Cu interconnect 604 has been removed from the bottom portion of the interlevel contact hole 608, which brings about such an advantage as lowering in the resistance between the underlying Cu interconnect 604 and upper second Cu interconnect 611. FIG. 10 is a plane view illustrating a case in which an interlevel insulating film is formed over an underlying interconnect and an upper interconnect is formed to have a dual damascene structure.

The foregoing invention has been described in terms of preferred embodiments. However, those skilled in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A process for forming a metal barrier layer on a surface of an interconnect of a wiring substrate embedded in an insulating film comprising the steps of:
   (a) abrading the substrate; and
   (b) feeding onto the substrate a plating solution having said metal dissolved therein, simultaneously with step (a),
   wherein said metal barrier is formed selectively on said interconnect, but not on said insulating film.

2. The process of claim 1 wherein the abrading and feeding steps are performed in an atmosphere having an oxygen partial pressure less than the oxygen partial pressure in the air.

3. The process of claim 1 further comprising the step of:
introducing a non-oxidative gas into the plating solution prior to feeding the plating solution onto the substrate.

4. The process of claim 1 further comprising the step of:
heating the substrate to a predetermined temperature prior to abrading the substrate.

5. The process of claim 1 further comprising the step of:
heating the plating solution to a predetermined temperature prior to abrading the substrate.

6. The process of claim 1 further comprising the step of:
heating the substrate and the plating solution to a predetermined temperature prior to abrading the substrate.

7. The process of claim 1 wherein the step of abrading the substrate comprises the steps of:
(i) contacting the substrate against an abrasive surface; and
(ii) causing relative motion between the abrasive surface and the substrate while the substrate is in contact with the abrasive surface.

8. The process of claim 7 further comprising the step of:
heating the substrate, the abrasive surface and the plating solution to a predetermined temperature prior to abrading the substrate.

9. The process of claim 7 wherein the relative motion between the abrasive surface and the substrate comprises rotary motion.

10. The process of claim 7 wherein the relative motion between the abrasive surface and the substrate comprises linear motion.

11. The process of claim 7 wherein the relative motion between the abrasive surface and the substrate comprises rotary and linear motion.

12. The process of claim 1 wherein said metal barrier layer has a higher melting point than that of a material of said interconnect.

13. The process of claim 1 further comprising the steps of:
irradiating a light to the surface of said substrate;
detecting a change in the intensity of light reflected from the surface of said substrate; and
terminating said process after a predetermined time passes from the detection of said change in the intensity of the light reflected from the surface of said substrate.

14. The process of claim 8 wherein said predetermined temperature is about 40° C. or greater but not greater than about 80° C.

15. The process of claim 7 wherein said abrasive surface comprises a pad made of a resin or cloth.

16. The process of claim 1 wherein said interconnect comprises mainly copper or a copper-containing alloy, and said metal barrier layer comprises either a Co—W alloy or a Ni—W alloy.

17. The process of claim 1 wherein the concentration of an alkali metal ion contained in the plating solution is 10 ppm or less.

18. The process of claim 1 wherein the concentration of sodium ions contained in the plating solution is 10 ppm or less.

19. The process of claim 1 wherein the concentration of dissolved oxygen in the plating solution is maintained lower than the equilibrium with the air.

20. The process of claim 1 wherein prior to the abrading step, a pretreatment step is performed comprising the steps of:
(i) contacting the substrate against an abrasive surface;
(ii) feeding a pretreatment solution between the substrate and the abrasive surface wherein the pretreatment solution is selected from the group consisting of an acid solution, an alkali solution and water; and
(iii) causing relative motion between the abrasive surface and the substrate while the substrate is in contact with the abrasive surface.

21. The process of claim 7 wherein the temperature of said substrate is maintained within ±5° C. of the temperature of the plating solution and wherein the plating solution has dissolved therein a metal having a higher melting point than that of a material of said interconnect.

22. The process of claim 7 wherein the temperature of said abrasive surface is maintained within ±5° C. temperature of the plating solution.

23. A process for manufacturing a semiconductor device having a wiring substrate embedded in an insulating film comprising the steps of:
forming a first metal film and a second metal film in a first trench of said insulating film formed over a substrate;
polishing said second metal film, thereby exposing said first metal film;
polishing said first metal film, thereby exposing said insulating film and forming a first interconnect in said first trench;
forming a metal barrier layer over at least a portion of said first interconnect by abrading the wiring substrate while simultaneously feeding onto the substrate a plating solution having said metal dissolved therein,
wherein said metal barrier is formed selectively on said first interconnect, but not on said insulating film.

24. The process of claim 23 further comprising the steps of:
forming an interlevel insulating film over said first interconnect having said metal barrier layer formed thereon;
forming a second trench in said interlevel insulting film to expose a portion of said metal barrier layer over said first interconnect;
forming a third metal film and a fourth metal film in said second trench;
polishing said fourth metal film, thereby exposing said third metal film;
polishing said third metal film to expose said interlevel insulating film and thereby form a second interconnect in said second trench.

25. The process of claim 24 wherein a portion of said metal barrier layer over said first interconnect is removed during the step of forming the second trench in said interlevel insulating film to expose a portion of said first interconnect and wherein said first and second interconnects contact each other.

* * * * *